United States Patent [19]

Hijikata et al.

[11] Patent Number: 4,465,553
[45] Date of Patent: Aug. 14, 1984

[54] METHOD FOR DRY ETCHING OF A SUBSTRATE SURFACE

[75] Inventors: Isamu Hijikata, Sagamihara; Akira Uehara, Yokohama; Hisashi Nakane, Kawasaki, all of Japan

[73] Assignee: Tokyo Denshi Kagaku Co., Ltd., Kawasaki, Japan

[21] Appl. No.: 551,898

[22] Filed: Nov. 15, 1983

[30] Foreign Application Priority Data

Nov. 20, 1982 [JP] Japan ............................... 57-203857

[51] Int. Cl.³ ...................... H01L 21/306; B44C 1/22; C03C 15/00; C03C 25/06
[52] U.S. Cl. .................................... 156/643; 156/646; 156/657; 156/659.1; 156/662; 204/192 E; 252/79.1
[58] Field of Search ............ 156/643, 646, 657, 659.1, 156/662; 204/192 E; 252/79.1; 427/38, 39

[56] References Cited

U.S. PATENT DOCUMENTS 4,330,384  5/1982  Okudaira et al. .............. 204/192 E Primary Examiner—William A. Powell
Attorney, Agent, or Firm—Brisebois & Kruger

[57] ABSTRACT

The invention provides a method for fine pattern-wise etching of a surface layer on a substrate such as semiconductor silicon wafers in a dry process by use of a gaseous mixture of pentafluorochloroethane and sulfur hexafluoride as the etching gas to support the plasma atmosphere. The inventive method is advantageous in the compatibility of the requirements for a large etching rate and a high precision of the fine patterning in contrast to the generally accepted understanding that these two requirements are not compatible with each other since an etching gas having a high etching rate causes remarkable side etching to decrease the precision of the desired patterning.

2 Claims, 3 Drawing Figures

MIXING RATIO OF $SF_6$, % BY VOLUME

MIXING RATIO OF SF$_6$, % BY VOLUME

METHOD FOR DRY ETCHING OF A SUBSTRATE SURFACE

BACKGROUND OF THE INVENTION

The present invention relates to a method for dry etching of a substrate surface or, more particularly, to a method for pattern-wise etching of a surface layer of, for example, elementary silicon or a compound of silicon formed on a substrate in a dry process by exposing the surface to an atmosphere of plasma.

As is known, manufacturing of various kinds of electronic devices such as ICs and LSIs includes a process of pattern-wise etching of a substrate surface or a surface layer formed on a substrate and the etching is performed either in a wet process using an etching solution or in a dry process by the techniques of, for example, plasma etching, sputtering etching, reactive ion etching (RIE), ion beam etching and the like. These dry process methods for etching are preferred to the wet process by virtue of the better precision for fine working and controllability as well as higher possibility of the process for simplification and automatization and less problems of environmental pollution.

On the other hand, the methods of dry etching are usually disadvantageous due to the expensiveness of the apparatus used in the method. In addition, problems are encountered in the selection of the etching gas when the method is industrially practiced. For example, use of a highly reactive gas capable of giving a high etching rate usually increases the undercutting or side etching behind the patterned areas of the resist layer so that the pattern formed by use of such an etching gas cannot be fine enough as desired while the use of an etching gas to cause less side etching necessarily takes a long time for the etching treatment due to the lower etching rate. Thus, the requirements for smaller side etching and higher etching velocity are incompatible with each other.

In particular, the dry etchings of a silicon compound or polysilicon which is important in the preparation of LSIs by the plasma etching is usually performed by use of a gaseous mixture of carbon tetrafluoride containing a few % by volume of oxygen as the plasma gas. This etching gas is currently most widely used due to the high etching rate of 300 to 600 nm/minute as well as due to the advantages in the selectivity, handleableness and safety. The etching proceeding by use of this mixed etching gas, however, is isotropic so that the width of a pattern formed by etching is usually smaller than the width of the pattern on the photomask through which the photoresist layer has been exposed to light and no etched pattern of a width of 3 μm or smaller can hardly be obtained by use of such an etching gas. In other words, precision in pattern-wise etching is an essential requirement in a high-precision fine working in compliance with the trend toward higher density and higher performance of LSIs and the like electronic devices which can be performed only by use of an etching gas having anisotropy or directionality in etching.

There is, however, usually a contradictory relationship between the anisotropy of etching and the etching rate. For example, sulfur hexafluoride gas cannot be used as an etching gas for fine patterning due to the large side etching resulting only in an unsatisfactory precision of patterning despite the high etching rate thereof. On the other hand, anisotropic etching with small side etching can be performed by use of a gaseous mixture of chlorine with carbon tetrachloride, pentafluorochloroethane or hexafluoroethane as the etching gas but the etching rate of these etching gases is as low as 100 to 200 nm/minute taking an unduly extended etching time so that certain disadvantages are unavoidable including the decrease in the thickness of the resist layer and poor selectivity in the etching relative to the base surface. At any rate, the requirements for the anisotropic etching and the higher etching rate are incompatible with each other and no etching gas for plasma etching is known in the prior art which satisfies both of these requirements.

SUMMARY OF THE INVENTION

It is therefore an object of the present invention to provide a method for fine patterning on a substrate surface by anisotropic etching with a high etching rate in a process of dry etching by means of exposure to a plasma atmosphere.

Thus, the method of the present invention for fine patterning on a substrate surface in a dry etching process comprises exposing the substrate surface to a plasma atmosphere generated in an atmosphere of a gaseous mixture composed of pentafluorochloroethane and sulfur hexafluoride in a limited proportion.

DETAILED DESCRIPTION OF THE PREFERRED EMBODIMENTS

The objective material to be subjected to dry etching according to the invention method is a substrate of, for example, semiconductor silicon wafer coated with a surface layer of single-crystalline or polycrystalline silicon, oxides and nitrides of silicon, metals such as molybdenum, niobium and tungsten, silicides of metals such as molybdenum silicide and the like. The surface layer formed of these materials may of course be doped with some dopants according to need. The method for forming such a surface layer on the substrate is well known in the art and not described here.

The apparatus used for conducting the dry etching according to the inventive method may be also conventional including a plasma etching apparatus with parallel-plate electrodes and reactive ion etching apparatus.

The most characteristic feature of the present invention is in the composition of the etching gas or the plasma-supporting gas which is essentially a gaseous mixture of pentafluorochloroethane and sulfur hexafluoride. The mixing ratio by volume of these gases should be in the range from 5:95 to 95:5 or, preferably, from 10:90 to 90:10 or, more preferably, from 20:80 to 70:30. When the etching gas is richer in sulfur hexafluoride than the above range, the strong isotropic etching power thereof causes increased side etching so that the precision of the desired pattern-wise etching is reduced while etching with an etching gas containing sulfur hexafluoride in a proportion smaller than above may take an unduly long time to obtain full etching due to the relatively low etching rate with the gaseous mixture. The pressure of the atmosphere filled with the gas should be a few Torr or below or, preferably, 1 Torr or below assuming that the etching gas is used as a plasma-supporting gas.

Figure 1:
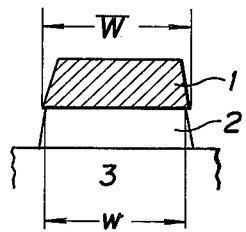
FIG. 1 is a schematic cross sectional view of a line pattern after etching with almost no side etching.
Figure 2:
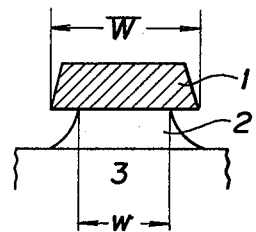
FIG. 2 is a schematic cross sectional view of a line pattern after etching with remarkable side etching on both sides of the line pattern.

The difference between the cross sectional configurations of the line patterns formed by the above described inventive method and the conventional method is well illustrated by the accompanying drawing, of which FIG. 1 is for the inventive method and FIG. 2 is for the conventional method. The substrate material 3, such as a silicon wafer, is provided successively with a surface layer 2 of, for example, silicon oxide and a resist layer 1 of, for example, a photosensitive material. The photolithographic processing for patterning provides a line pattern 1 having a width of W and then the thus patterned substrate is subjected to dry etching according to the inventive method so that the surface layer 2 is also etched pattern-wise on the areas not protected by the resist layer 1 to leave a line pattern 2 beneath the resist layer 1. In this case, side etching of the surface layer 2, i.e. etching of the surface layer 2 taking place behind the resist layer 1, is more or less unavoidable so that the width w of the line pattern of the surface layer 2 at the neck in contact with the lower surface of the resist layer 1 is smaller than W. In the inventive method, the difference between W and w is extremely small. On the other hand, the conventional method by use of an etching gas having strongly isotropic etching power results in the cross sectional configuration of the line pattern illustrated in FIG. 2 in which the neck width w of the line pattern of the surface layer 2 is much smaller than the width W of the line pattern of the resist layer 1. It is of course possible to obtain a cross sectional configuration of the line pattern which is substantially the same as in FIG. 1 even in the prior art though at a great sacrifice of the etching rate taking an unduly long time for the treatment.

As is understood from the above description, the method of the present invention is very advantageous due to the high precision of the fine patterns formed on a substrate surface obtained without sacrifice of the etching rate while it has been accepted in the prior art that these two requirements are incompatible with each other as is mentioned before.

In the following, the method of the present invention is illustrated in further detail by way of examples and comparative examples.

EXAMPLE 1 AND COMPARATIVE EXAMPLES 1 to 3

A semiconductor silicon wafer of 100 mm diameter was successively provided with a surface layer of phosphorus-doped polysilicon having a thickness of 600 nm and then with a photoresist layer. After a photolithographic processing of the photoresist layer to form a positive-type line pattern having a width of 3 $\mu$m, the silicon wafer was placed in a plasma chamber of a plasma etching apparatus equipped with parallel-plate electrodes and subjected to dry etching for 45 seconds with a 2:1 by volume mixture of pentafluorochloroethane and sulfur hexafluoride as the etching gas to support the plasma atmosphere. The pressure of the gaseous mixture inside the plasma chamber was 0.6 Torr and the power supply to the electrodes was 200 watts. Measurement of the wafer taken out of the plasma chamber indicated that the average etching rate was 800 nm/minute and the neck width w of the line pattern of the surface layer formed of the phosphorus-doped polysilicon was 2.85 $\mu$m with a very little difference with the line width W of 3 $\mu$m in the resist pattern or with a very small side etching of only 0.15 $\mu$m.

For comparison, the same experimental procedure as above was repeated except that the etching gas was replaced with a gaseous mixture of 96% by weight of carbon tetrafluoride and 4% by weight of oxygen, sulfur hexafluoride alone and pentafluorochloroethane alone as Comparative Examples 1, 2 and 3, respectively, and the pressure of the etching gas and the etching time were varied to obtain full etching.

The results of the above experiments are summarized in Table 1 below which includes the gaseous pressure, the etching time, the average etching rate and the neck width w of the line pattern of the surface layer formed of the phosphorus-doped polysilicon.

TABLE 1

|  | Inventive Example | Comparative Example | | |
|---|---|---|---|---|
|  |  | 1 | 2 | 3 |
| Etching gas | $C_2ClF_5$ + $SF_6$ | $CF_4$ + $O_2$ | $SF_6$ | $C_2ClF_5$ |
| Gaseous pressure, Torr | 0.6 | 0.6 | 0.4 | 0.4 |
| Etching time, seconds | 45 | 120 | 45 | 240 |
| Average etching rate, nm/minute | 800 | 300 | 800 | 150 |
| Neck width w, $\mu$m | 2.85 | 2.4 | 2.0 | 2.9 |
| Side etching W-w, $\mu$m | 0.15 | 0.6 | 1.0 | 0.1 |

The above tabulated results indicate that the inventive method is very advantageous in greatly reducing the narrowing of the neck width w when a high etching velocity as in Comparative Example 2 is desired and also in greatly increasing the etching rate, for example, by 5 times or more with about the same neck width w retained as in Comparative Example 3.

EXAMPLE 2

Figure 3:
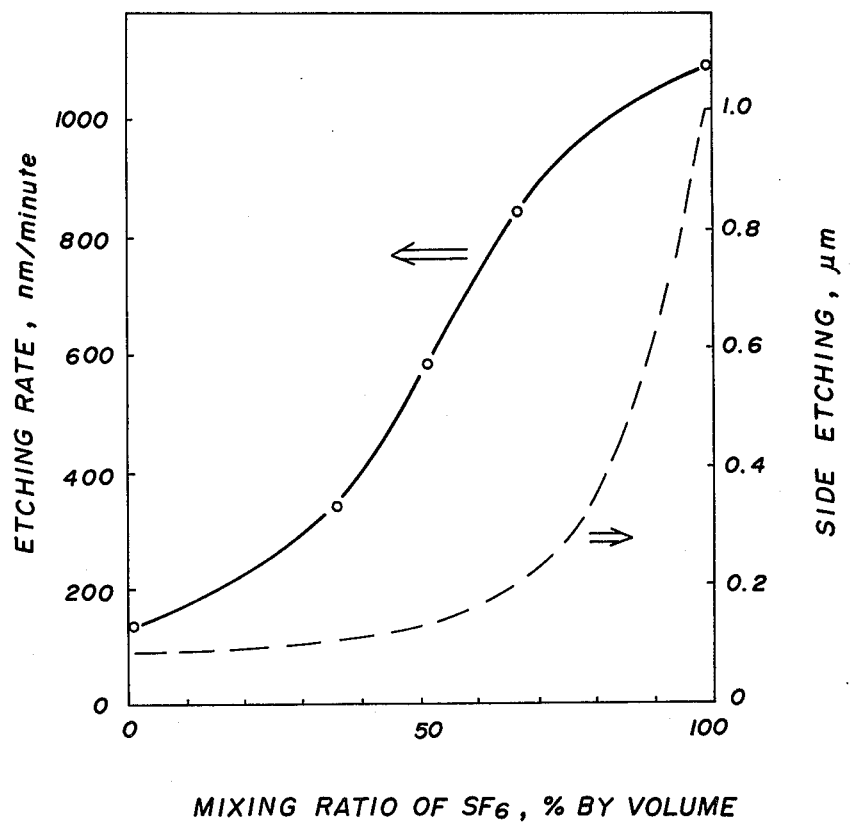
FIG. 3 is a graphic showing of the etching rate and extent of side etching each as a function of the mixing ratio of pentafluorochloroethane and sulfur hexafluoride in the etching gas.

About the same experimental procedure as in Example 1 above was repeated except that the electric power supply to the electrodes for generating plasma was 150 watts and the gaseous pressure inside the plasma chamber was 0.4 Torr with varied mixing ratios of pentafluorochloroethane and sulfur hexafluoride including pure pentafluorochloroethane and pure sulfur hexafluoride. The average etching rate and the side etching expressed by W - w shown in FIGS. 1 or 2 were determined for each of the line patterns formed by this dry etching and graphically shown in FIG. 3 taking the proportion of sulfur hexafluoride in the gaseous plasma atmosphere in % by volume as the abscissa and the average etching rate in nm/minute and the side etching W - w in $\mu$m as the ordinates.

What is claimed is:

1. A method for pattern-wise etching of a surface layer of a substrate by a dry process which comprises exposing the surface layer on the substrate to an atmosphere of plasma generated in a gaseous mixture of pentafluorochloroethane and sulfur hexafluoride.

2. The method as claimed in claim 1 wherein the ratio of the pentafluorochloroethane and sulfur hexafluoride in the gaseous mixture is in the range from 5:95 to 95:5 by volume.

* * * * *